United States Patent
Sabharwal et al.

(10) Patent No.: US 6,738,953 B1
(45) Date of Patent: May 18, 2004

(54) SYSTEM AND METHOD FOR MEMORY CHARACTERIZATION

(75) Inventors: Deepak Sabharwal, Fremont, CA (US); Alex Shubat, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 91 days.

(21) Appl. No.: 10/092,056

(22) Filed: Mar. 5, 2002

Related U.S. Application Data (60) Provisional application No. 60/295,038, filed on Jun. 1, 2001.

(51) Int. Cl.[7] .............................................. G06F 17/50
(52) U.S. Cl. ................................ 716/1; 716/18; 716/11
(58) Field of Search ............................. 716/1, 2, 3, 4, 716/5, 8, 11, 12, 13, 17, 18, 7, 21, 29; 712/32, 18, 15, 12, 79; 711/5, 7, 109, 11, 170

(56) References Cited

U.S. PATENT DOCUMENTS

| | | | | |
|---|---|---|---|---|
| 5,548,524 A | * | 8/1996 | Hernandez et al. | ........... 716/12 |
| 5,822,218 A | * | 10/1998 | Moosa et al. | ................... 716/4 |
| 6,212,668 B1 | * | 4/2001 | Tse et al. | ........................ 716/7 |
| 6,408,422 B1 | * | 6/2002 | Hwang et al. | ................. 716/3 |
| 6,470,489 B1 | * | 10/2002 | Chang et al. | ................. 716/21 |
| 2001/0052062 A1 | * | 12/2001 | Lipovski | ..................... 712/32 |

* cited by examiner

Primary Examiner—Matthew Smith
Assistant Examiner—Binh C. Tat
(74) Attorney, Agent, or Firm—Danamraj & Youst, P.C.

(57) ABSTRACT

A memory characterization system and method using a hierarchically-stitched netlist generation technique. A plurality of leaf cells forming a memory instance are generated based on a minimum area required to encompass an optimal number of memory strap points relating to global signals that span the memory instance. Input and output pins are defined for each tile with respect to the global signals in both horizontal and vertical directions. A parametric dataset is obtained for each tile using an extractor (wherein the memory instance is in post-layout condition) or a pre-layout wire-delay estimator. The parametric netlist for the entire memory instance is assembled by coupling the individual parametric datasets using the input and output pins of the tiles with respect to the global signals.

49 Claims, 7 Drawing Sheets

| NUMBER OF CONNECTS ~502 | DESIGN SIZE - 1 ~504-1 | DESIGN SIZE - 2 ~504-2 | ... | DESIGN SIZE - N ~504-N |
|---|---|---|---|---|
| 1 | $R_{11} = 1\,\Omega$<br>$C_{11} = 5fF$<br>506 | $R_{12} =$<br>$C_{12} =$ | ... | $R_{1N} =$<br>$C_{1N} =$ |
| 2 | $R_{21} = 1.5\,\Omega$<br>$C_{21} = 7fF$<br>508 | $R_{22} =$<br>$C_{22} =$ | ... | $R_{2N} =$<br>$C_{2N} =$ |
| ... | ... | ... | ... | ... |
| M | $R_{M1} =$<br>$C_{M1} =$ | $R_{M2} =$<br>$C_{M2} =$ | ... | $R_{MN} =$<br>$C_{MN} =$ |

SYSTEM AND METHOD FOR MEMORY CHARACTERIZATION

PRIORITY UNDER 35 U.S.C. §119(e) & 37 C.F.R. §1.78

This nonprovisional application claims priority based upon the following prior United States Provisional Patent Application entitled: System And Method For Memory Characterization, Application No.: 60/295,038, filed Jun. 1, 2001, in the names of Deepak Sabharwal and Alex Shubat, which is hereby incorporated by reference for all purposes.

BACKGROUND OF THE INVENTION

1. Technical Field of the Invention

The present invention relates generally to semiconductor memories, and more particularly, to a system and method for efficiently characterizing a memory instance.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design reuse is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that speed and power consumption are two of the more significant factors in designing a high performance memory instance, whether provided as a stand-alone device or in an embedded application. In order to ensure that a memory circuit operates in an optimal manner as per design, the device is rigorously characterized during its design phase with respect to several key performance criteria. Typically, timing parameters such as cycle time ($t_{cc}$), clock-to-Q delay ($t_{cq}$), et cetera, are estimated by running simulations on a suitable parametric netlist (e.g., an RC netlist) extracted from the memory circuit's layout. Whereas extracting parametric netlists for memory instances is a relatively straightforward process, it becomes highly cumbersome when high density memory is involved because of the large amounts of data generated thereby. Not only do the storage requirements for such data quickly reach unmanageable levels, but the engineering time necessary to perform full-scale characterization of a memory device becomes prohibitive as well.

State-of-the-art solutions to address these concerns generally involve the use of what are known as PI-models for estimating the various resistive and capacitive loadings that give rise to the delay in a memory circuit. Although these solutions are fairly effective with respect to reducing engineering time and database storage requirements, they are nevertheless beset with several deficiencies and shortcomings. For example, it is commonly known that the use of PI-models, which are based on transmission line techniques, for estimating memory loadings gives rise to inaccurate results, thereby throwing off the timing estimates by a significant percentage. In general, such inaccuracies are due to inadequate representation of the secondary and higher-order electrical effects (e.g., capacitive coupling) inherent in memory circuits. Also, where an end user of memory (e.g., a value-added system integrator) is desirous of fine-tuning a memory circuit to suit its specific applications, there exists a critical lack of appropriate knowledge such that building necessary PI-models is out of the question. Furthermore, the current solutions are also unsatisfactory with respect to memory circuit power estimations.

SUMMARY OF THE INVENTION

Accordingly, the present invention is directed to an efficient memory characterization system and method using a hierarchically-stitched netlist generation technique that advantageously overcomes these and other aforementioned deficiencies of the state-of-the-art solutions. Based on the physical architecture (i.e., floor plan) of a memory instance, which may be an embedded memory circuit or a stand-alone device, a plurality of repeatable blocks or tiles are generated with respect to each distinct section of the floor plan. The array portion of the memory instance is thus segmented into a number of bitcell array tiles arranged as rows and columns spanning the array, wherein each bitcell array tile comprises a select number of cells in rows and columns. An individual bitcell array tile is accordingly associated with a predetermined number of wordlines (WLs) and bitlines (BLs). Similarly, the row decoder (X-DEC) section of the memory instance is also correspondingly segmented into a column of vertically-stacked row decoder tiles, wherein each row decoder tile is operable to be coupled to a select row of bitcell array tiles via a select number of WLs. The input/output (I/O) block of the memory instance is analogously segmented into a row of horizontally-stacked I/O tiles as well, each I/O tile corresponding to a specified number of BLs. The control block of the memory instance is preferably provided as a single tile having connections to the vertically-stacked row decoder tiles as well as the horizontally-stacked I/O tiles.

The repeatable tiles, also referred to as leaf cells, thus comprise the entire memory instance and are preferably created depending on a minimum area required to encompass an optimal number of memory strap points relating to the global signals that span the memory instance. I/O pins (or, nodes) are defined for each tile with respect to the global signals in horizontal and vertical directions as the case may be. A parametric dataset is obtained for each tile using an extractor (where the memory instance is in post-layout condition) or a pre-layout wire-delay estimator. The parametric netlist for the entire memory instance is assembled thereafter by appropriately coupling the individual parametric datasets using the I/O pins of the tiles with respect to the global signals.

In a further aspect, the present invention is directed to a computer-accessible medium operable in connection with a processor environment, wherein the computer-accessible medium carries a sequence of instructions which, when executed in the processor environment, cause the various steps involved in the memory characterization scheme of the present invention as summarized hereinabove.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
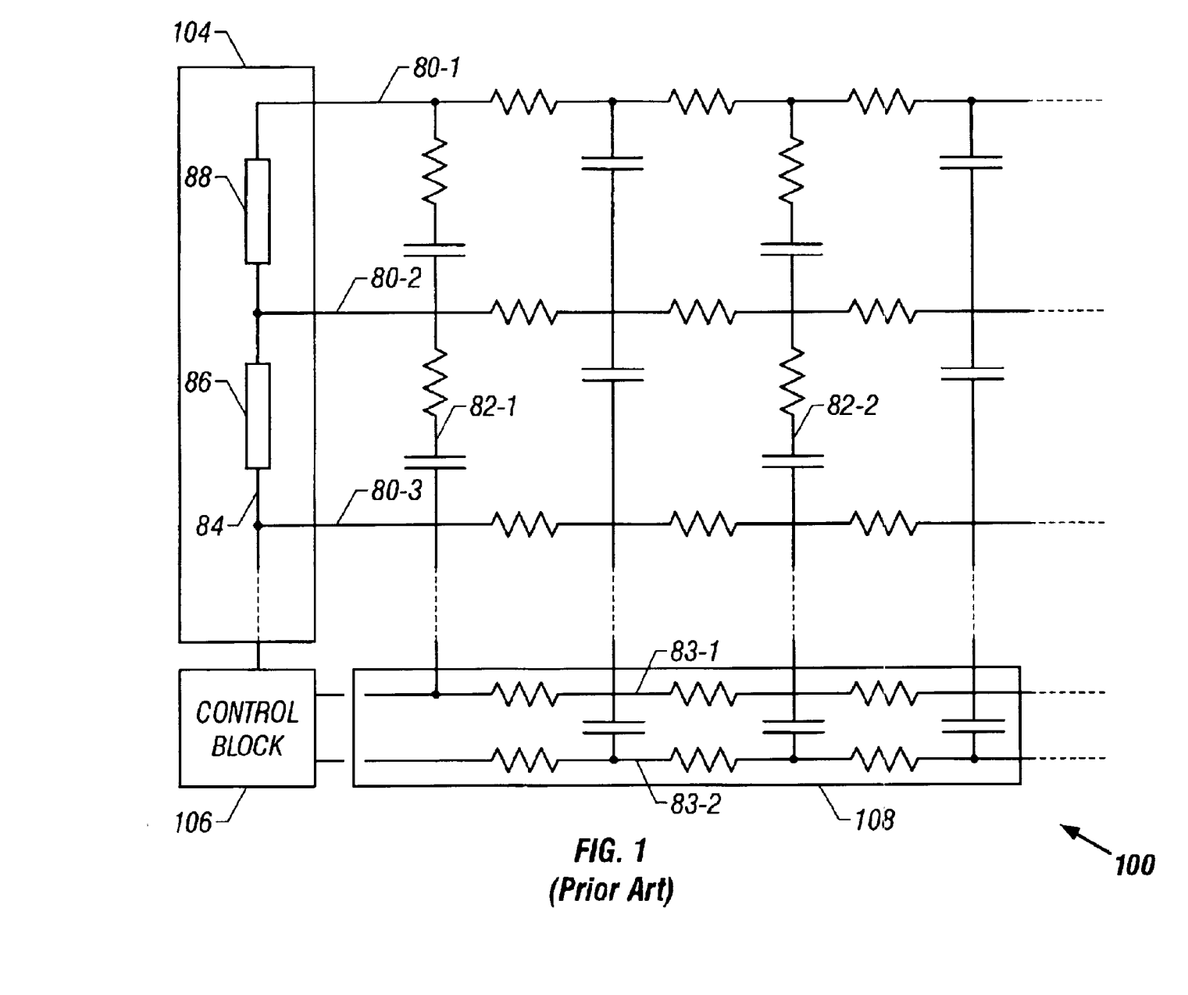
FIG. 1 (Prior Art) depicts a conventional PI-model representation for deriving an RC netlist for a memory circuit.

In the drawings, like or similar elements are designated with identical reference numerals throughout the several views thereof, and the various elements depicted are not necessarily drawn to scale. Referring now to FIG. 1, depicted therein is a conventional PI-model representation for deriving an RC netlist for a memory circuit 100. A plurality of memory cells organized as an array and various global signal lines associated therewith (e.g., bitlines and wordlines) are modeled as resistive and capacitive loadings that span horizontally or vertically. Reference numerals 80-1, 80-2 and 80-3 exemplify three global lines in the array's X-direction. Similarly, reference numerals 82-1 and 82-2 exemplify two global lines in Y-direction of the array.

A control block 106 is associated with the memory 100 is operable to provide horizontal and vertical control signals to an I/O block 108 and a row decoder 104, respectively. With respect to the global signal paths of I/O block 108, these global paths are also modeled as global resistive lines spanning the width of the circuit, with capacitive loadings suitably placed. For instance, reference numerals 83-1 and 83-2 illustrate two such global lines associated with I/O block 108 in X-direction. In similar fashion, reference numeral 84 refers to a single global line spanning the row decoder, which global line is modeled with appropriate RC elements (reference numerals 86 and 88, for example).

As pointed out in the Background section of the present patent application, conventional RC netlist extraction involves a full block extraction, that is, the entire memory block is used, which gives rise to very slow extraction and simulation. Further, such a process is prone to error due to parametric variances across the array in X- and Y-directions.

Figure 2A:
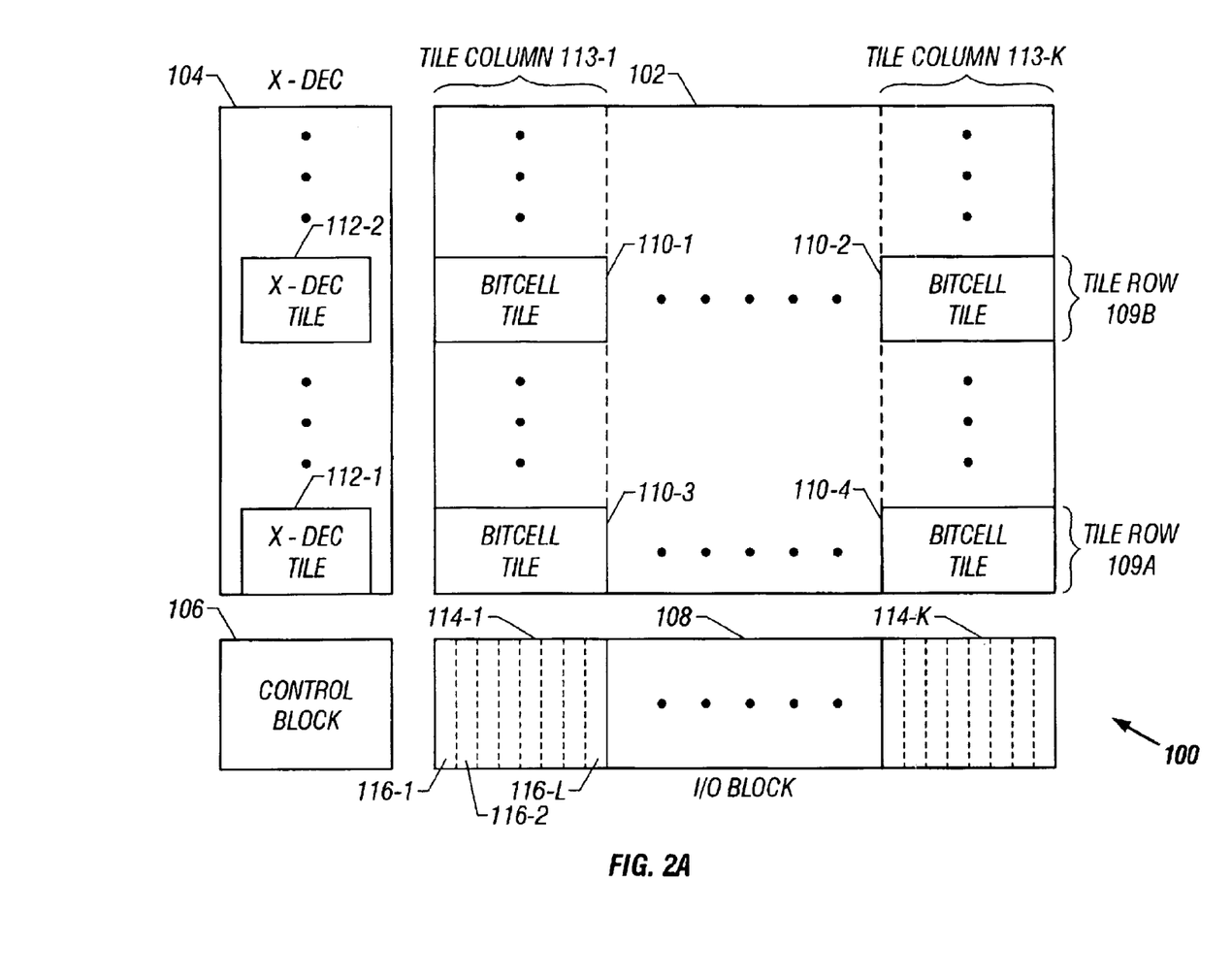
FIG. 2A depicts a physical architectural view of an exemplary memory instance wherein a plurality of repeatable tiles ("leaf cells") may be formed in accordance with the teachings of the present invention.

FIG. 2A depicts a physical architectural view (i.e., floor plan) of the exemplary memory instance 100 that is modeled as a plurality of repeatable tiles ("leaf cells") in accordance with the teachings of the present invention. It should be recognized by those skilled in the art that the exemplary memory instance 100 may comprise any memory circuit such as, e.g., a dynamic random access memory (DRAM) circuit, a static random access memory (SRAM) circuit, a read-only memory (ROM) circuit, an erasable programmable ROM (EPROM) circuit, a flash memory circuit, and the like. Moreover, the memory instance 100 may be provided as a compilable embedded memory circuit or as a stand-alone memory device.

The exemplary memory instance 100 comprises a memory array (also referred to as a bitcell array) 102 formed of a plurality of bitcells and organized in known manner. Row decoder (X-DEC) 104, control block 106, and column multiplex (MUX) and I/O block 108, are also provided in known manner for effectuating the functionality of the memory instance 100.

Those skilled in the art will appreciate upon reference hereto that in further exemplary embodiments, the physical architecture of the memory instance 100 may include any hitherto known or unknown design variations. Thus, for instance, the memory instance 100 can also comprise a memory array with a plurality of banks, divided wordlines, redundancy and reference bitline/wordline portions, centrally-placed row decoders, and/or a variable number of I/Os with applicable column MUXing schemes.

In accordance with the teachings of the present invention, the various sections of the memory instance 100 are divided into one or more repeatable leaf cells which comprise the entire memory when tiled together. The bitcell array 102 is segmented into a plurality of bitcell array tiles organized into a suitable number of rows and columns. For example, reference numerals 110-1 and 110-2 refer to two bitcell tiles on a particular row 109B. In similar fashion, reference numerals 110-3 and 110-4 refer to two bitcell tiles on another row 109A. Furthermore, bitcell tiles 110-1 and 110-3 and bitcell tiles 110-2 and 110-4 are disposed on two separate columns 113-1 AND 113-K, respectively.

Each bitcell array tile is comprised of a plurality of bitcells organized into a sub-matrix of select number of rows and columns. Preferably, the tiles are created depending on a minimum area required to encompass an optimal number of memory strap points relating to a plurality of global signals that span the memory instance 100. In an exemplary embodiment, the tiles are selected such that each tile captures all the strap points that repeat as a unit. For instance, where the wordlines are strapped for every 16 cells, a 16-column wide tile may be selected.

Corresponding to the rows of the bitcell tiles, X-DEC 104 is also segmented into a plurality of vertically-stacked row decoder tiles. In the exemplary embodiment depicted in FIG. 2A, row decoder tile 112-1 corresponds to the row 109A of bitcell tiles 110-3 and 110-4. In similar fashion, row decoder tile 112-2 corresponds to the row 109B of bitcell tiles 110-1 and 110-2.

In a presently preferred exemplary embodiment of the present invention, a single tile may be provided for the control block 106 of the memory instance 100, which block provides global pre-decoder signals in the vertical direction to the row decoder tiles. Further, the control block 106 also generates a set of global I/O control signals in the horizontal direction towards the I/O block 108 of the memory instance 100.

Continuing to refer to FIG. 2A, the I/O block 108 is segmented into a plurality of horizontally-stacked I/O tiles (reference numerals 114-1 through 114-K) that correspond to the bitcell tile columns. Each I/O tile is comprised of a select number of I/Os depending on the MUX arrangement of the memory instance. Reference numerals 116-1 through 116-L refer to a plurality of I/Os comprising the I/O tile 114-1. For example, where the number of BLs in a bitcell tile column is 32 and the MUX factor is 4, the number of I/Os in an I/O tile will be 8.

Figure 2B:
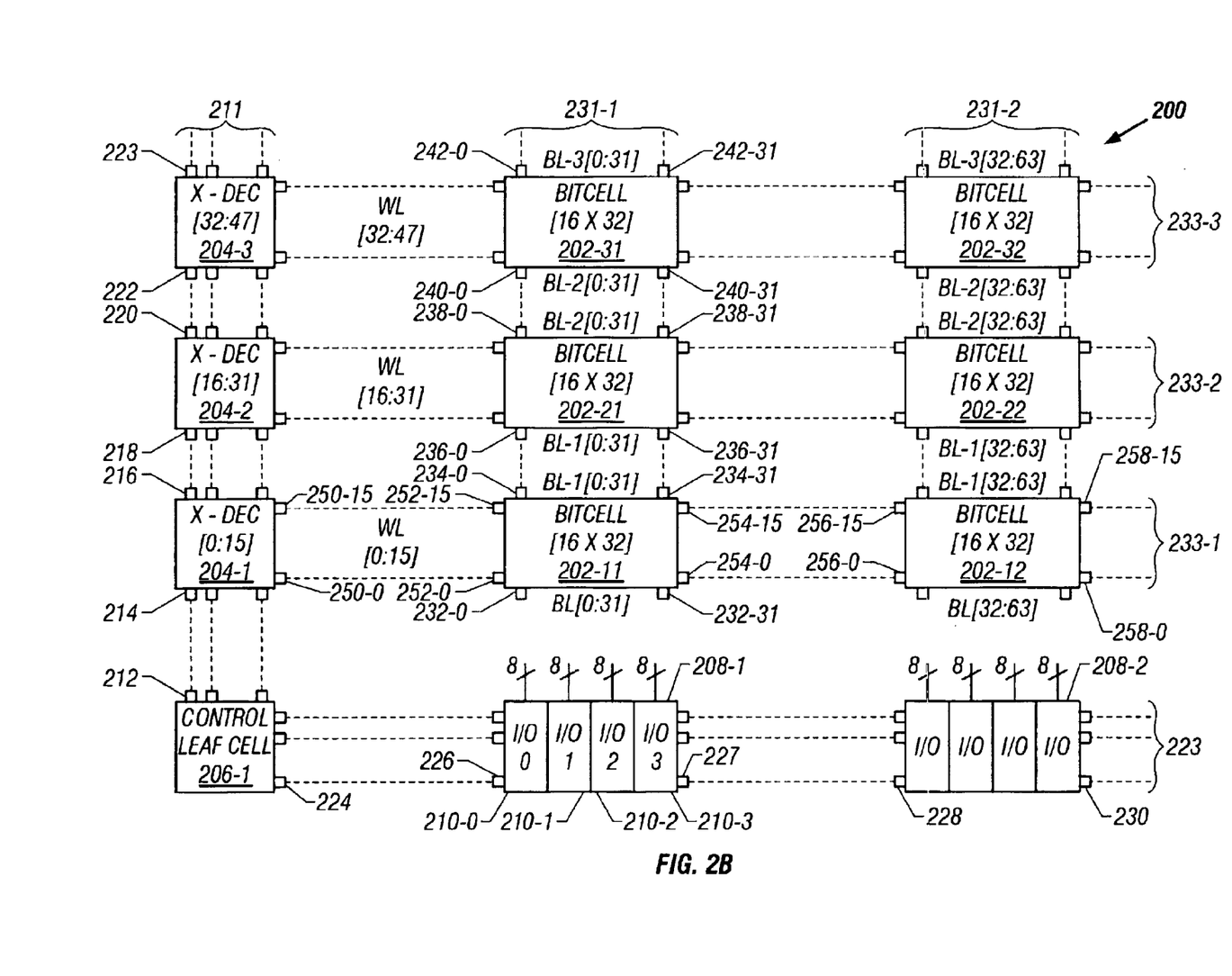
FIG. 2B depicts a particular exemplary memory instance wherein the array is divided into a plurality of 16×32 bitcell array tiles having input and output pins for global signals in both horizontal and vertical directions.

In accordance with the teachings of the present invention, a plurality of I/O pins are defined for each tile of the memory instance with respect to the global signals that span in horizontal and/or vertical directions. FIG. 2B depicts a particular exemplary memory instance wherein the array 200 is divided into a plurality of 16×32 bitcell array tiles with specific input and output pins identified therein for the applicable global signals. Reference numerals 202-11, 202-21, 202-31, 202-12, 202-22, and 202-32 refer to 6 exemplary bitcell array tiles arranged in a 3×2 matrix. As can be readily seen in FIG. 2A, bitcell array tiles 202-11, 202-21 and 202-31 form the first column and bitcell array tiles 202-12, 202-22, and 202-32 form the second column of the depicted array tile matrix. In similar fashion, bitcell array tiles 202-11 and 202-12, bitcell array tiles 202-21 and 202-22, and bitcell array tiles 202-31 and 202-32 form, respectively, the three rows of the array tile matrix.

Reference numerals 204-1, 204-2 and 204-3 refer to three row decoder tiles that correspond to the three rows of the bitcell array tile matrix. Each X-DEC tile is operable to provide 16 global WLs that span horizontally for interconnecting the bitcell tile row associated therewith. In accordance with the teachings of the present invention, the global WLs are segmented for each bitcell array tile traversed thereby in a particular row of the array tile matrix. Reference numerals 233-1 through 233-3 refer to 3 sets of WLs, each comprising 16, that traverse the array tile rows. Further, the segmented WLs are operable to be coupled in a head-to-tail fashion from one tile to another along the horizontal direction by virtue of a first plurality of appropriately defined I/O pins associated with the tiles. For example, X-DEC tile 204-1 associated with WL[0:15] global signals 233-1 is provided 16 corresponding output pins 250-0 through 250-15, which can be coupled to 16 input pins 252-0 through 252-15 of the bitcell array tile 202-11. In turn, the bitcell array tile 202-11 is provided with 16 output pins (reference numerals 254-0 through 254-15) with respect to the 16 global WLs, which output pins are operable to be coupled to the corresponding input pins 256-0 through 256-15 of the next bitcell array tile (i.e., tile 202-12) in the tile row. Similarly, output pins 258-0 through 258-15 are defined for the bitcell array tile 202-12 regarding the WLs 233-1 for connecting with the next bitcell array tile, and so on.

Reference numerals 208-1 and 208-2 refer to two I/O block tiles that correspond to the two tile columns of the bitcell array tile matrix. Each I/O block tile is associated with 32 BLs that span vertically for interconnecting the bitcell tile column associated therewith. Analogous to the global WLs, the BLs are segmented for each bitcell array tile traversed thereby in a particular column of the array tile matrix. Reference numerals 231-1 and 231-2 refer to 2 sets of BLs, each comprising 32, that traverse the array tile columns. Based on the exemplary MUX factor of 8, each I/O block tile is provided with 4 I/Os such that a single I/O is operable to accommodate 8 BLs of the corresponding set of 32 BLs. For instance, reference numerals 210-0 through 210-3 refer to I/O-0 through I/O-3 of the I/O block tile 208-1.

Furthermore, similar to the WL arrangement described hereinabove, the segmented BLs are operable to be coupled in a head-to-tail fashion from one tile to another along the vertical direction by virtue of a second plurality of appropriately defined I/O pins associated with the tiles. In the exemplary embodiment depicted in FIG. 2B, the 32 BLs 231-1 provided with respect to the I/O block tile 208-1 are operable to be coupled to the corresponding 32 input pins 232-0 through 232-31 of the bitcell array tile 202-11 via a suitable MUX8 arrangement. In turn, the bitcell array tile 202-11 is provided with 32 output pins in the vertical direction (reference numerals 234-0 through 234-31) with respect to the 32 global BLs, which output pins are operable to be coupled to the corresponding input pins 236-0 through 236-31 of the next bitcell array tile (i.e., tile 202-21) in the tile column. Similarly, output pins 238-0 through 238-31 are defined for the bitcell array tile 202-21 regarding the BLs 231-1 for connecting to the input pins 240-0 through 240-31 of the bitcell array tile 202-31 that is stacked above the bitcell array tile 202-21. Reference numerals 242-0 through 242-31 refer to the output pins of the bitcell array tile 202-31 for connecting with the next bitcell array tile in the array tile matrix with reference to the global BL signals 231-1.

Continuing to refer to FIG. 2B, control block tile 206-1 is associated with a first plurality of global signals (i.e., pre-decoder signals, for instance) 211 operable to traverse the X-DEC tiles in the vertical direction and a second plurality of global signals (i.e., I/O control signals) 223 operable to traverse the I/O block tiles in the horizontal direction. Accordingly, a first set of output pins with respect to the vertical global signals 211 and a second set of output pins with respect to the horizontal global signals 223 are defined for the control block tile 206-1. Reference numerals 212 and 224 are illustrative of the two sets of control block tile output pins, respectively. Similar to the input and output pins defined for the bitcell array tiles as described hereinabove, the X-DEC tiles and I/O block tiles are provided with a set of input pins and output pins for coupling with the control block tile and the remaining tiles in a head-to-tail manner, either in the vertical direction (with respect to the global signals 211 for the X-DEC tiles) or in the horizontal direction (with respect to the global signals 223 for the I/O block tiles. In FIG. 2B, input pins 214, 218 and 222, and output pins 216, 220 and 223 are illustrative with particular reference to the global signals 211 traversing the X-DEC tiles. In similar fashion, input pins 226 and 228, and output pins 227 and 230 are illustrative with particular reference to the global signals 223 traversing the I/O block tiles.

Within the complex of the tiles as set forth above, each tile is modeled with appropriate RC elements that accurately represents the parametric loading associated with that particular tile. In accordance with the teachings of the present invention, the tile-specific RC elements are then connected together because of the I/O pins provided for the tiles. In other words, for each tile, an RC element is disposed between its input and output pins that correspond to a particular global line. For instance, with reference to bitcell array tile 202-11, an RC element (RCWL) is disposed between input pin 252-15 and the corresponding output pint 254-15, an RC element between input pin 252-14 and the corresponding output pin 254-14, and so on for the remaining 14 I/O pin pairs. As mentioned above, the output pins of the bitcell array tile 202-11 are connected to the input pins of the bitcell array tile 202-12, referring to the global signals in X-direction. In similar manner, appropriate RC elements (RCBL) are provided for the bitcell array tiles with respect to the global signals in Y-direction. Furthermore, appropriate RC elements are provided for the X-DEC and I/O block tiles, which are operable to be stitched together in Y-direction and X-direction, respectively.

Figure 3:
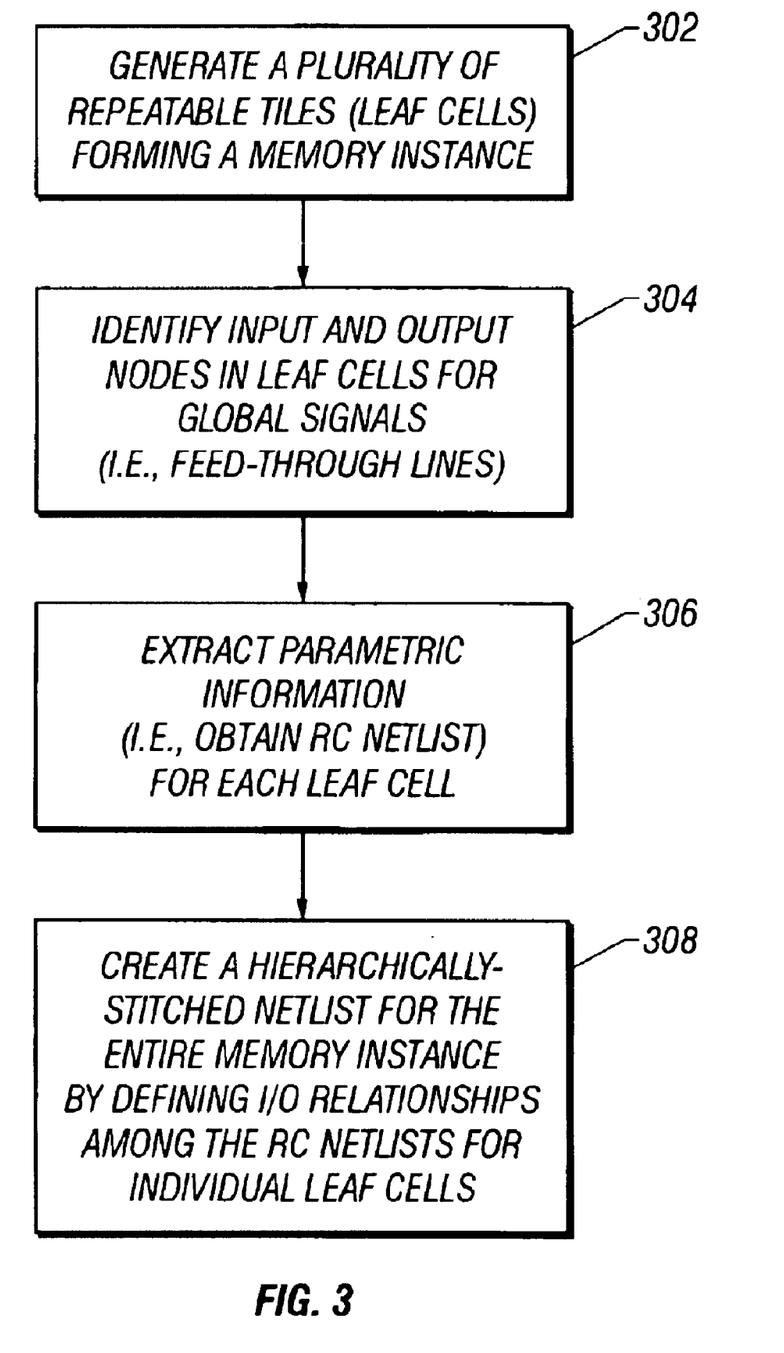
FIG. 3 is a flow chart of the steps involved in an exemplary embodiment of the memory characterization scheme of the present invention.

Referring now to FIG. 3, depicted therein is a flow chart of the steps involved in an exemplary embodiment of the memory characterization scheme of the present invention, wherein a memory instance embodied in a post-layout schema such as what is known as the GDS format is to be characterized with respect to its performance (e.g., timing data dependent upon on the RC parametric information). Based on the floor plan of the memory instance for which the parametric netlist is to be obtained, a plurality of leaf cells (i.e., tiles) spanning the entire memory are generated as described in greater detail hereinabove (step 302). Various input pins, output pins, or both, are also identified for each leaf cell with respect to a plurality of global signals that feed through the leaf cells in vertical and/or horizontal directions (step 304). A distributed extraction process is employed thereafter to extract the appropriate parametric information dataset (i.e., a sub-netlist) for each leaf cell (step 306). A hierarchically-stitched netlist for the entire memory instance is subsequently created by identifying the predetermined input and output pins (i.e., pins) of the sub-netlists to be appropriately coupled, wherein the pinouts of the extracted sub-netlists are suitably changed to ensure head-to-tail connectivity in vertical and/or horizontal directions (step 308). Thereafter, an appropriate simulation process may be implemented (not shown) with respect to the memory instance's netlist for obtaining timing data, for performing power simulations, et cetera.

Figure 4:
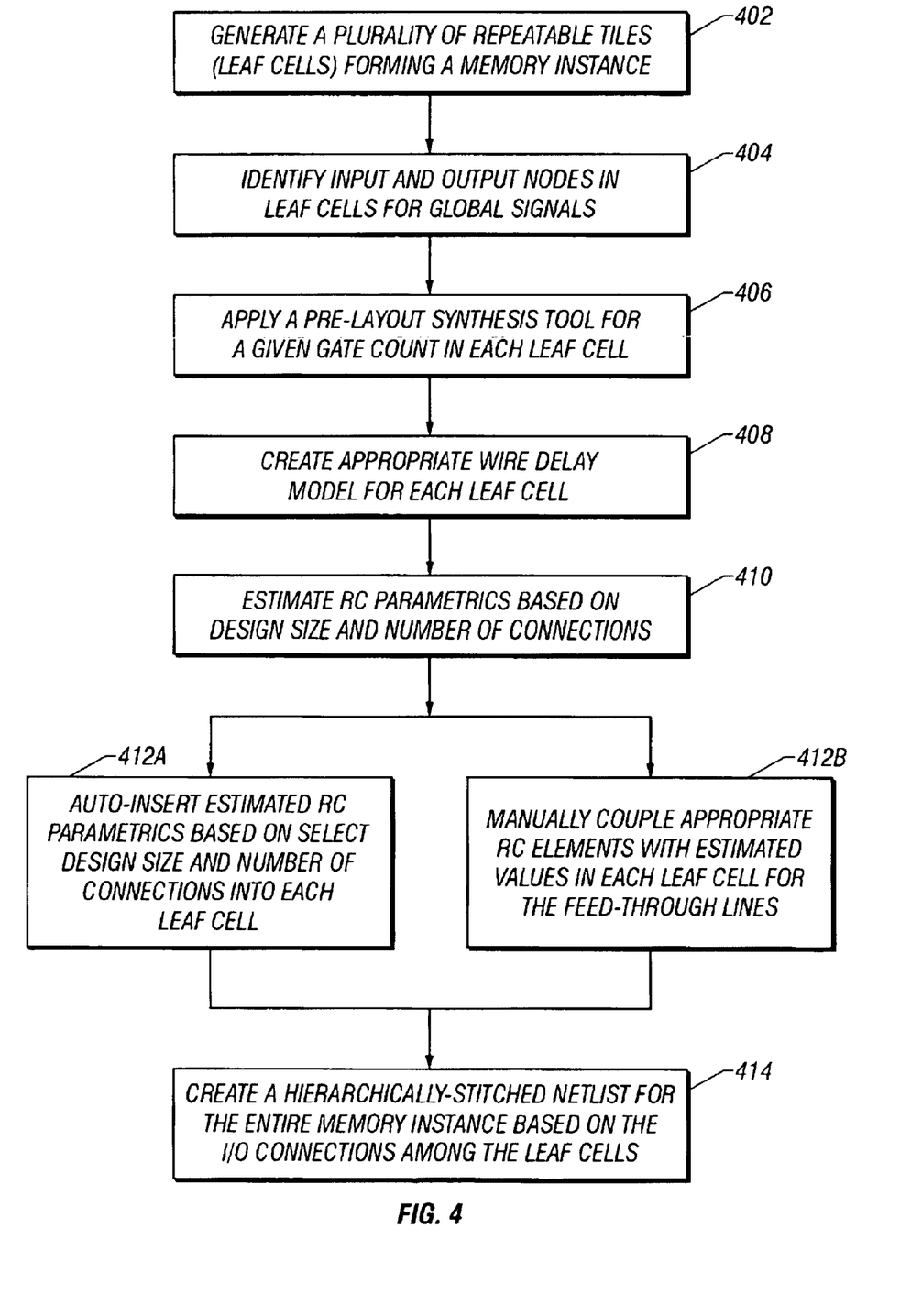
FIG. 4 is a flow chart of the steps involved in another exemplary embodiment of the memory characterization scheme of the present invention.

As is well known in the art, timing data for memory designs involving deep submicron technology is increasingly more dependent on the resistive (R) and capacitive (C) components of the wiring of the memory circuitry rather than the transistor loading. Accordingly, where the memory instance has not yet been rendered in a GDS layout (i.e., prior to formalizing the memory instance's routing connectivity), the exemplary memory characterization scheme described hereinabove needs to be suitably modified. FIG. 4 is a flow chart of the steps involved in a further exemplary embodiment of the memory characterization scheme of the present invention, wherein the memory instance to be characterized is in a pre-layout condition. Similar to the flow set forth above, a plurality of leaf cells are generated for the memory instance (step 402). Input and output pins are then identified for each leaf cell with respect to a plurality of select global signals traversing the leaf cells in vertical and/or horizontal directions (step 404). In accordance with the teachings of the present invention, a pre-layout synthesis tool is applied thereafter with respect to a given cell/gate count in each leaf cell (step 406). Subsequently, appropriate wire-delay models are created for the leaf cells (step 408). Based thereon, RC parametric look-up tables (LUTs) for the leaf cells are generated wherein the R and C values are estimated using the wire-delay models by taking into account (i) design size information (i.e., cell areas) and (ii) the number of connects involved (step 410).

Figure 5:
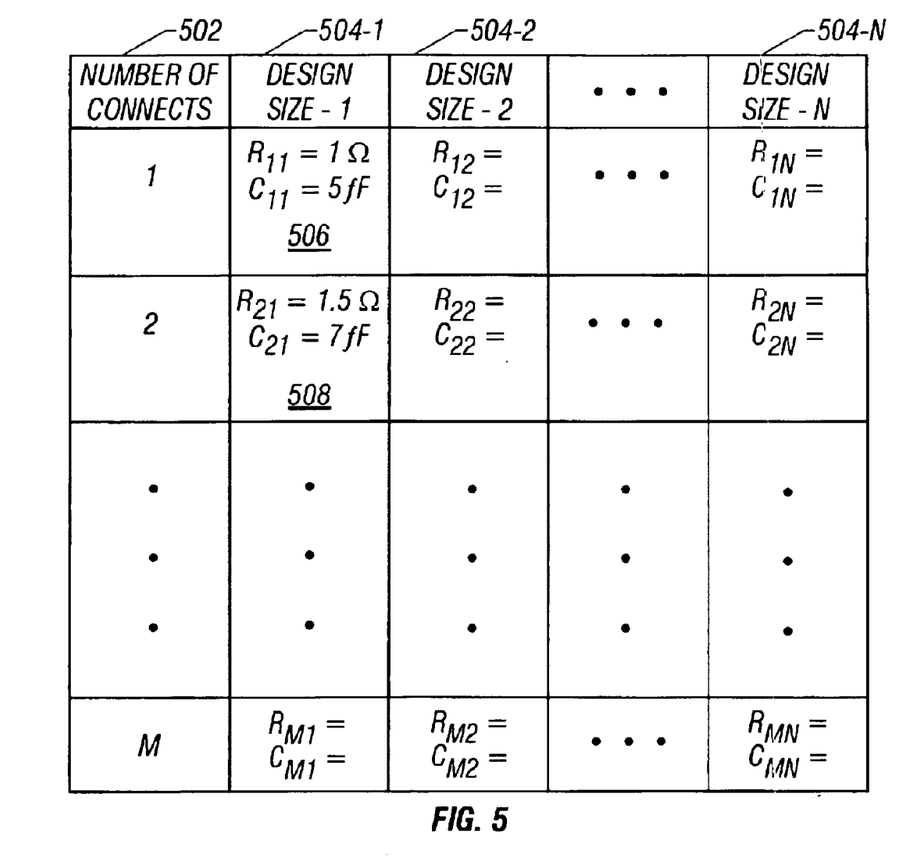
FIG. 5 is an exemplary parametric look-up table (LUT) based on pre-layout wire-delay models of the tiles.

FIG. 5 is an exemplary parametric LUT based on a pre-layout wire-delay model of the tiles for a given number of connects 502 and a plurality of design sizes 504-1 through 504-N. By way of illustration only, reference numeral 506 therein exemplifies R and C estimates (R11=1 Ω; C11=5 fF) for a first design size with one connection. Similarly, reference numeral 508 exemplifies R and C estimates (R21=1.5 Ω; C11=7 fF) for the first design size with two connections.

Continuing to refer to FIG. 4 again, upon obtaining the estimated RC parametric LUTs, the in characterization flow can involve either an auto-insert process (step 412A) or a semi-manual process (step 412B). In the auto-insert mode, the RC parametric values based on a select design size and number of connects are inserted by means of appropriate software into each tile. It should be appreciated that because the insertion of the estimated RC parametric data is automatic, it may be applied to both non-feed-through connections (i.e., local connections internal to the tile) as well as global feed-through connections that traverse the tiles. In the semi-manual mode, appropriate RC elements with the estimated values are placed in the tile for the global signals only. Once the wiring-related RC estimates are in place via either mode, complete parametric datasets for the individual tiles are obtained and hierarchically-stitched (in a manner similar to the process described above for the post-layout characterization method) to create the parametric netlist for the entire memory instance based on the inter-tile input/output connections (step 414). Appropriate simulation process or processes may take place thereafter.

Figure 6:
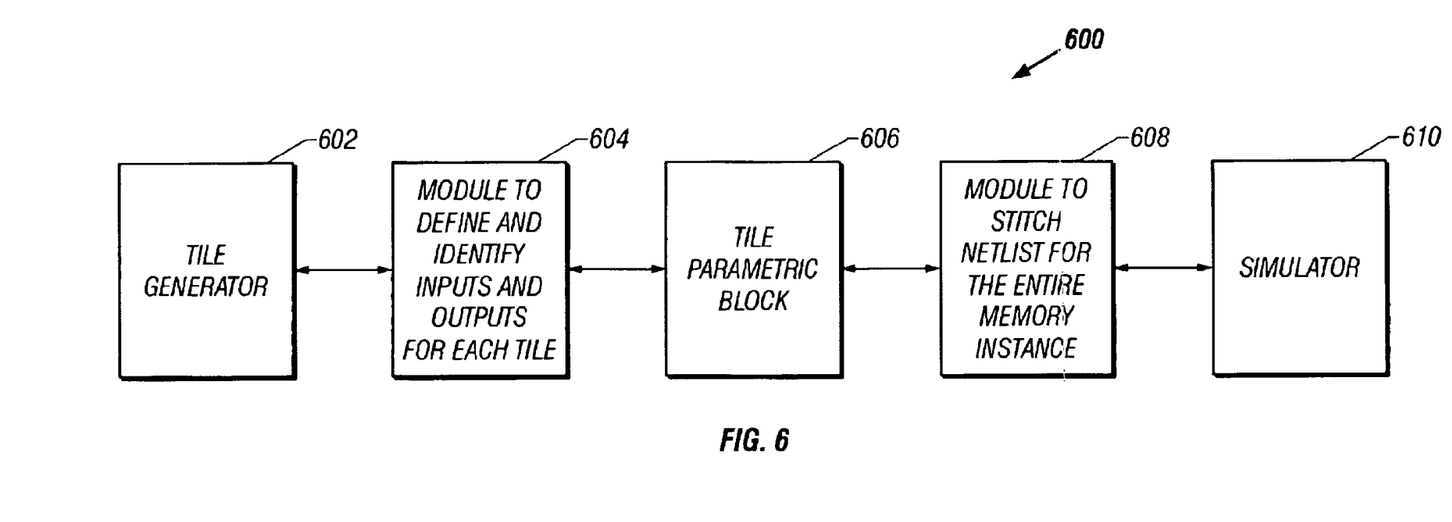
FIG. 6 depicts an exemplary embodiment of the memory characterization system of the present invention.

FIG. 6 depicts an exemplary embodiment of the memory characterization system 600 of the present invention, preferably implemented in software, firmware, hardware, or in any combination thereof, as a computer-accessible medium operable in connection with a suitable processor environment that is optimized for executing memory design and characterization flows. A tile generator module 602 is operable to generate a plurality of tiles or leaf cells based on a given memory instance's floor plan and relevant information including the aspect ratio, total number of cells, BLs, WLs, the MUX factor and I/Os, et cetera. A module 604 coupled to the tile generator 602 is operable to identify and define various input and output pins for each tile with respect to a plurality of global signals that traverse the memory instance in vertical and/or horizontal directions. A tile parametric block 606 is operable to obtain a parametric dataset for each of the tiles, either by means of an extractor (where the memory instance is in post-layout condition) or an estimator based on wire-delay models (where the memory instance is in pre-layout condition). A module 608 coupled to the tile parametric block 606 is operable to create a parametric netlist for the entire memory instance by hierarchically-stitching the individual datasets as described in greater detail hereinabove. An appropriate simulator block 610 may also be preferably included for running timing simulations and/or power estimates using the memory instance's netlist.

Based on the foregoing, it should be appreciated that the present invention provides an innovative solution that advantageously overcomes the various shortcomings and deficiencies of the state-of-the-art memory characterization schemes set forth in the Background section of the present patent application. Because of the hierarchical organization of the present invention's memory instance netlists, which is facilitated by providing appropriate I/O pins for the hierarchical tiles, faster simulation times and easier probing of pins are achieved for purposes of RC determinations. Also, no huge amounts of data are generated, thereby alleviating the need for high storage requirements. In addition, accuracy in the simulated timing data is not compromised because the geometry-specific variations (which are inherent in the conventional full-block extraction) are sufficiently minimized.

Whereas the teachings of the present invention have been particularly exemplified with the extraction of RC netlists, those skilled in the art should readily recognize upon having reference hereto that RCL extraction is also amenable to the hierarchical netlist methodology described herein. Such improvements and variations would be especially applicable with respect to reduced geometries, e.g., $0.1\mu/0.07\mu$ technologies.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims.

What is claimed is:

1. A memory characterization method, comprising the steps:

generating a plurality of tiles operable to model a memory instance, said plurality of tiles including at least one of a sub-plurality of row decoder tiles, a sub-plurality of input/output (I/O) block tiles, a sub-plurality of bitcell array tiles and at least one control block tile;

providing input and output pins for each tile with respect to a plurality of global signals spanning said memory instance in at least one of a horizontal and a vertical direction;

obtaining a parametric dataset for each of said plurality of tiles; and creating a hierarchically-stitched parametric netlist for said memory instance by coupling said parametric datasets using said input and output pins of said plurality of tiles with respect to said global signals, said hierarchically-stitched parametric netlist for simulating said memory instance.

2. The memory characterization method as set forth in claim 1, wherein said tiles are generated based on a minimum area required to encompass an optimal number of memory strap points associated with at least a portion of said global signals.

3. The memory characterization method as set forth in claim 1, wherein said memory instance comprises a post-layout schema, and further wherein said step of obtaining a parametric dataset for each of said plurality of tiles comprises extracting an RC netlist from a select portion of said post-layout schema corresponding to a particular tile.

4. The memory characterization method as set forth in claim 1, wherein said memory instance comprises a pre-layout schema, and further wherein said step of obtaining a parametric dataset for each of said plurality of tiles comprises estimating RC parametric data corresponding to a particular tile based on its wire-delay model.

5. The memory characterization method as set forth in claim 4, wherein said wire-delay model is based on said particular tile's design size parameter.

6. The memory characterization method as set forth in claim 4, wherein said wire-delay model is based on a connection number parameter corresponding to said particular tile.

7. The memory characterization method as set forth in claim 1, wherein said plurality of tiles are operable to model a memory instance comprising a read-only memory (ROM) circuit.

8. The memory characterization method as set forth in claim 1, wherein plurality of tiles are operable to model a memory instance comprising a static random access memory (SRAM) circuit.

9. The memory characterization method as set forth in claim 1, wherein plurality of tiles are operable to model a memory instance comprising a dynamic random access memory (DRAM) circuit.

10. The memory characterization method as set forth in claim 1, wherein said plurality of tiles are operable to model a memory instance comprising an electrically programmable ROM (EPROM) circuit.

11. The memory characterization method as set forth in claim 1, wherein said plurality of tiles are operable to model a memory instance comprising a flash memory circuit.

12. The memory characterization method as set forth in claim 1, wherein said plurality of tiles are operable to model a memory instance comprising a compilable memory circuit.

13. The memory characterization method as set forth in claim 1, wherein said plurality of tiles are operable to model a memory instance comprising an embedded memory circuit.

14. The memory characterization method as set forth in claim 1, wherein said plurality of tiles are operable to model a memory instance comprising a stand-alone memory circuit.

15. The memory characterization method as set forth in claim 1, wherein said global signals comprise a plurality of pre-decoder signals emanating from said at least one control block tile, said pre-decoder signals being operable to couple said sub-plurality of row decoder tiles in a head-to-tail fashion along said vertical direction.

16. The memory characterization method as set forth in claim 1, wherein said global signals comprise a plurality of wordline signals emanating from said sub-plurality of row decoder tiles.

17. The memory characterization method as set forth in claim 16, wherein each row decoder tile is coupled to a corresponding portion of said plurality of wordline signals, said corresponding portion being operable to couple a select row of said sub-plurality of bitcell array tiles in a head-to-tail fashion along said horizontal direction.

18. The memory characterization method as set forth in claim 1, wherein said global signals comprise a plurality of control signals emanating from said at least one control block tile, said control signals being operable to couple said sub-plurality of I/O block tiles in a head-to-tail fashion along said horizontal direction.

19. The memory characterization method as set forth in claim 1, wherein said global signals comprise a plurality of bitline signals emanating from said sub-plurality of I/O block tiles.

20. The memory characterization method as set forth in claim 19, wherein each I/O block tile is coupled to a corresponding portion of said plurality of bitline signals, said corresponding portion being operable to couple a select column of said sub-plurality of bitcell array tiles in a head-to-tail fashion along said vertical direction.

21. The memory characterization method as set forth in claim 1, wherein said global signals comprise a plurality of power lines coupling said sub-plurality of I/O block tiles with said sub-plurality of bitcell array tiles in said vertical direction.

22. A memory characterization system, comprising:

means for generating a plurality of tiles operable to model a memory instance, said plurality of tiles including at least one of a sub-plurality of row decoder tiles, a sub-plurality of input/output (I/O) block tiles, a sub-plurality of bitcell array tiles and at least one control block tile;

means for identifying input and output pins for each tile with respect to a plurality of global signals spanning said memory instance in at least one of a horizontal and a vertical direction;

means for obtaining a parametric dataset for each of said plurality of tiles; and means for creating a hierarchically-stitched parametric netlist for said memory instance by coupling said parametric datasets using said input and output pins of said plurality of tiles with respect to said global signals, said hierarchically-stitched parametric netlist for simulating said memory instance.

23. The memory characterization system as set forth in claim 22, wherein said means for obtaining a parametric dataset comprises one of a post-layout extractor tool and a pre-layout parametric wire-delay estimator.

24. The memory characterization system as set forth in claim 22, wherein said memory instance comprises one of a DRAM circuit, an SRAM circuit, a ROM circuit, an EPROM circuit and a flash memory circuit.

25. The memory characterization system as set forth in claim 22, wherein said memory instance comprises an embedded memory circuit.

26. The memory characterization system as set forth in claim 22, wherein said memory instance comprises a compilable memory circuit.

27. The memory characterization system as set forth in claim 22, wherein said memory instance comprises a stand-alone memory circuit.

28. The memory characterization system as set forth in claim 22, wherein said global signals comprise a plurality of pre-decoder signals emanating from said at least one control block tile, said pre-decoder signals being operable to couple said sub-plurality of row decoder tiles in a head-to-tail fashion along said vertical direction.

29. The memory characterization system as set forth in claim 22, wherein said global signals comprise a plurality of wordline signals emanating from said sub-plurality of row decoder tiles.

30. The memory characterization system as set forth in claim 29, wherein each row decoder tile is coupled to a corresponding portion of said plurality of wordline signals, said corresponding portion being operable to couple a select row of said sub-plurality of bitcell array tiles in a head-to-tail fashion along said horizontal direction.

31. The memory characterization system as set forth in claim 22, wherein said global signals comprise a plurality of control signals emanating from said at least one control block tile, said control signals being operable to couple said sub-plurality of I/O block tiles in a head-to-tail fashion along said horizontal direction.

32. The memory characterization system as set forth in claim 22, wherein said global signals comprise a plurality of bitline signals emanating from said sub-plurality of I/O block tiles.

33. The memory characterization system as set forth in claim 32, wherein each I/O block tile is coupled to a corresponding portion of said plurality of bitline signals, said corresponding portion being operable to couple a select column of said sub-plurality of bitcell array tiles in a head-to-tail fashion along said vertical direction.

34. The memory characterization system as set forth in claim 22, wherein said global signals comprise a plurality of power lines coupling said sub-plurality of I/O block tiles with said sub-plurality of bitcell array tiles in said vertical direction.

35. A computer-accessible medium operable in connection with a processor environment, said computer-accessible medium carrying a sequence of instructions which, when executed in said processor environment, cause the following steps to be performed:

generating a plurality of repeatable tiles operable to model a memory instance, said plurality of tiles including at least one of a sub-plurality of row decoder tiles, a sub-plurality of input/output (I/O) block tiles, a sub-plurality of bitcell array tiles and at least one control block tile;

identifying input and output pins for each tile with respect to a plurality of global signals spanning said memory instance in at least one of a horizontal and a vertical direction;

obtaining a parametric dataset for each of said plurality of tiles; and creating a hierarchically-stitched parametric netlist for said memory instance by coupling said parametric datasets using said input and output pins of plurality of tiles with respect to said global signals, said hierarchically-stitched parametric netlist for simulating said memory instance.

36. The computer-accessible medium as set forth in claim 35, wherein said step of obtaining a parametric dataset for each of said plurality of tiles comprises extracting an RC netlist from a select portion of a post-layout schema corresponding to a particular tile.

37. The computer-accessible medium as set forth in claim 35, wherein said step of obtaining a parametric dataset for each of said plurality of tiles comprises estimating RC parametric data corresponding to a particular tile based on its pre-layout wire-delay model.

38. The computer-accessible medium as set forth in claim 35, wherein said memory instance comprises one of a DRAM circuit, an SRAM circuit, a ROM circuit, an EPROM circuit and a flash memory circuit.

39. The computer-accessible medium as set forth in claim 35, wherein said memory instance comprises an embedded memory circuit.

40. The computer-accessible medium as set forth in claim 35, wherein said memory instance comprises a compilable memory circuit.

41. The computer-accessible medium as set forth in claim 35, wherein said memory instance comprises a stand-alone circuit.

42. The computer-accessible medium as set forth in claim 35, wherein said global signals comprise a plurality of pre-decoder signals emanating from said at least one control block tile, said pre-decoder signals being operable to couple said sub-plurality of row decoder tiles in a head-to-tail fashion along said vertical direction.

43. The computer-accessible medium as set forth in claim 35, wherein said global signals comprise a plurality of wordline signals emanating from said sub-plurality of row decoder tiles.

44. The computer-accessible medium as set forth in claim 43, wherein each row decoder tile is coupled to a corresponding portion of said plurality of wordline signals, said corresponding portion being operable to couple a select row of said sub-plurality of bitcell array tiles in a head-to-tail fashion along said horizontal direction.

45. The computer-accessible medium as set forth in claim 35, wherein said global signals comprise a plurality of control signals emanating from said at least one control block tile, said control signals being operable to couple said sub-plurality of I/O block tiles in a head-to-tail fashion along said horizontal direction.

46. The computer-accessible medium as set forth in claim 35, wherein said global signals comprise a plurality of bitline signals emanating from said sub-plurality of I/O block tiles.

47. The computer-accessible medium as set forth in claim 46, wherein each I/O block tile is coupled to a corresponding portion of said plurality of bitline signals, said corresponding portion being operable to couple a select column of said sub-plurality of bitcell array tiles in a head-to-tail fashion along said vertical direction.

48. The computer-accessible medium as set forth in claim 35, wherein said global signals comprise a plurality of power lines coupling said sub-plurality of I/O block tiles with said sub-plurality of bitcell array tiles in said vertical direction.

49. The computer-accessible medium as set forth in claim 35, wherein said tiles are generated based on a minimum areas required to encompass an optimal number of memory strap points associated with at least a portion of said global signals.

* * * * *